United States Patent [19]

Hocker et al.

[11] Patent Number: 5,295,395
[45] Date of Patent: Mar. 22, 1994

[54] DIAPHRAGM-BASED-SENSORS

[76] Inventors: G. Benjamin Hocker, 5730 Covington Cir., Minnetonka, Minn. 55345; David W. Burns, 5537 1st Ave. South, Minneapolis, Minn. 55419; Akintunde I. Akinwande, 9968 Nord Rd., Bloomington, Minn. 55437; Robert D. Horning, 4 Oak Shore Dr., Burnsville, Minn. 55337; Amir R. Mirza, 2125 Aquila Ave., Golden Valley, Minn. 55427; Thomas G. Stratton, 3000 Sandy Hook Dr., Roseville, Minn. 55113; Deidrich J. Saathoff, 205 Woodland Dr., Burnsville, Minn. 55337; James K. Carney, 7310 Paulsen Dr., Eden Prairie, Minn. 55346; Scott A. McPherson, 837 Curry Trail, Eagan, Minn. 55123

[21] Appl. No.: 652,148

[22] Filed: Feb. 7, 1991

[51] Int. Cl.$^5$ .............................. G01L 13/02
[52] U.S. Cl. ......................... 73/721; 73/727; 92/103 SD; 338/4
[58] Field of Search ............... 73/715-728, 73/182; 92/103 R, 103 SD; 338/4; 361/283

[56] References Cited

U.S. PATENT DOCUMENTS

| | | | |
|---|---|---|---|
| 4,730,496 | 3/1988 | Knecht et al. | 73/724 |
| 4,744,863 | 5/1988 | Guckel et al. | 156/653 |
| 4,790,192 | 12/1988 | Knecht et al. | 73/721 |
| 5,029,479 | 7/1991 | Bryan | 73/721 |

FOREIGN PATENT DOCUMENTS 0339981 11/1989 European Pat. Off. .

OTHER PUBLICATIONS

Scaling Limitations of Submicron Local Oxidation Technology, Hui, et al, IEEE, IDEM, 1985 pp. 392-395.
The SWAMI-A Defect-Free and Near-Zero Bird's Beak Local Oxidation Process and its Application in VLSI Technology, Chiu, et al, IEEE, IDEM, 1982, pp. 224-227.
German Publication WO-A-9 116 608 (Robert Bosch GMBH), Priority Date Apr. 14, 1990.
Wescon Conference Record-Silicon Fusion Bonding: Revolutionary New Tool for Silicon Sensors and Microstructures Dr. Kurt Petersen & Dr. Phillip Barth, Nov., 1989.
European Patent Application 0 341 964 A3, H. Furubayashi, et al, Filed May 5, 1989.
Patent Abstracts of Japan, No. JP 2122675 (Fuji Electric Company Limited) published on May 10, 1990.
German Publication WO-A-9009677, Guckel, et al, filed Feb. 2, 1990.

*Primary Examiner*—Donald O. Woodiel

[57] ABSTRACT

The formation of diaphragms by silicon wafer bonding provides for a structure having at least two such diaphragms with cavities in the wafers to which the diaphragm layer is bonded. Passageways through the wafers provide for communication of a fluid to the diaphragms. In some locations less than all of a plurality of diaphragms may be bonded to only one wafer having a cavity adjacent the diaphragm.

4 Claims, 10 Drawing Sheets

DIAPHRAGM-BASED-SENSORS

BACKGROUND

This patent relates to the formation of diaphragm based microstructures used primarily for sensors at this time, in which the diaphragm may be used by sensing a change in deflection, resonance, or curvature as a result of environmental influences which are allowed to reach the sensor diaphragm. Particular sensors are described which may be constructed from the method of manufacture. The method described and structures shown are primarily silicon based, either single crystal form or polycrystalline in form, but other materials could also be used. Recently there has been a substantial interest in microstructures. A survey of structures and methods was published in Scientific American in Apr. 1983, Angel et al, "Silicon Micromechanical Devices". The article describes a sensor similar to the pressure sensor of FIG. of this patent, constructed through micromachining or chemical etching including "pits, holes, pyramids, trenches, hemispheres, cantilevers, diaphragms, needles and walls".

However, it was found that there are process reliability problems, particularly with producing diaphragm structures. Also, there is now a desire to produce more complex diaphragm structures. For example, where a wafer having a diaphragm on one side is placed over another wafer with a corresponding cavity below the diaphragm, bonding the two wafers at high temperatures may cause the diaphragm to permanently deform due to expansion of gases trapped on one side but not on the other. Attempting to provide a bond by merely contacting the two wafers having clean surfaces, is a well known method, and it is also described in U.S. Pat. No. 4,638,552 but it does not produce a satisfactory strong bond for the purpose of producing reliable sensors. In contrast, it has long been known that high temperature bonding of silicon can produce a strong bond.

Diaphragm-based sensors usually have within them electrical sensor elements, such as piezoresistors or capacitor elements, and these elements, once fabricated, can be damaged by subsequent high temperature processing. An additional problem thus arises in the fabrication of multiple wafer diaphragm structures, where the bonding of some wafers must occur after the formation of such electrical sensor elements.

One approach to manufacturing steps for diaphragm microstructures are taught in European patent application 89304173.1, entitled "Laminated Semiconductor Sensor With Overpressure Protection", filed Apr. 26, 1989. The process described in it, however, not only does not protect the diaphragm during processing, but adds the piezoresistive sensors before the high temperature fusing of the wafers and therefore creates a risk that these resistors or other sensitive electrical components will also be damaged by subsequent processing. No process previously known teaches how to adequately protect the sensor through the bonding process.

Also, where it is useful or desired to have a very flat or polished surface in which one surface of the diaphragm forms a contiguous part thereof, there has heretofore not been known a satisfactory method for polishing, without causing damage to the diaphragm.

Other known methods for building diaphragm based microsensors are either more difficult manufacturing processes than fusion bonding of wafers as shown in the European Application No. 89304173.1 (above-mentioned), or do not yield the same result sought here. An example of a "depositing" method can be found in U.S. Pat. No. 4,744,863 issued to Guckel and Burns. Their work was used in U.S. Pat. No. 4,592,238 by Busta. The Guckel/Burns process, as related by Busta, employs "post" oxide (column 2, line 50 et seq) which is deposited onto the substrate layer and the diaphragm (polycrystalline silicon) is deposited onto this post oxide. The post oxide is later removed by leaving a diaphragm supported by deposited material only along its edges.

As an additional form of protection for sensitive electrical elements, this invention employs a low temperature electrostatic bonding process after the creation of such elements without using backfill in situations where the diaphragm itself is not likely to be too damaged.

Certain enhancements to the design and method of manufacture of these diaphragm sensors is also described herein. These features enhance the flexibility of uses to which the sensors can be put.

The series of FIGS. 3a–e depicts five steps from side-view of the wafers in the Low Temperature Oxidation backfill process.

The series of FIGS. 4a–e depicts five steps from side-view of the wafers in the Thermal Oxidation backfill process.

Figure 5:
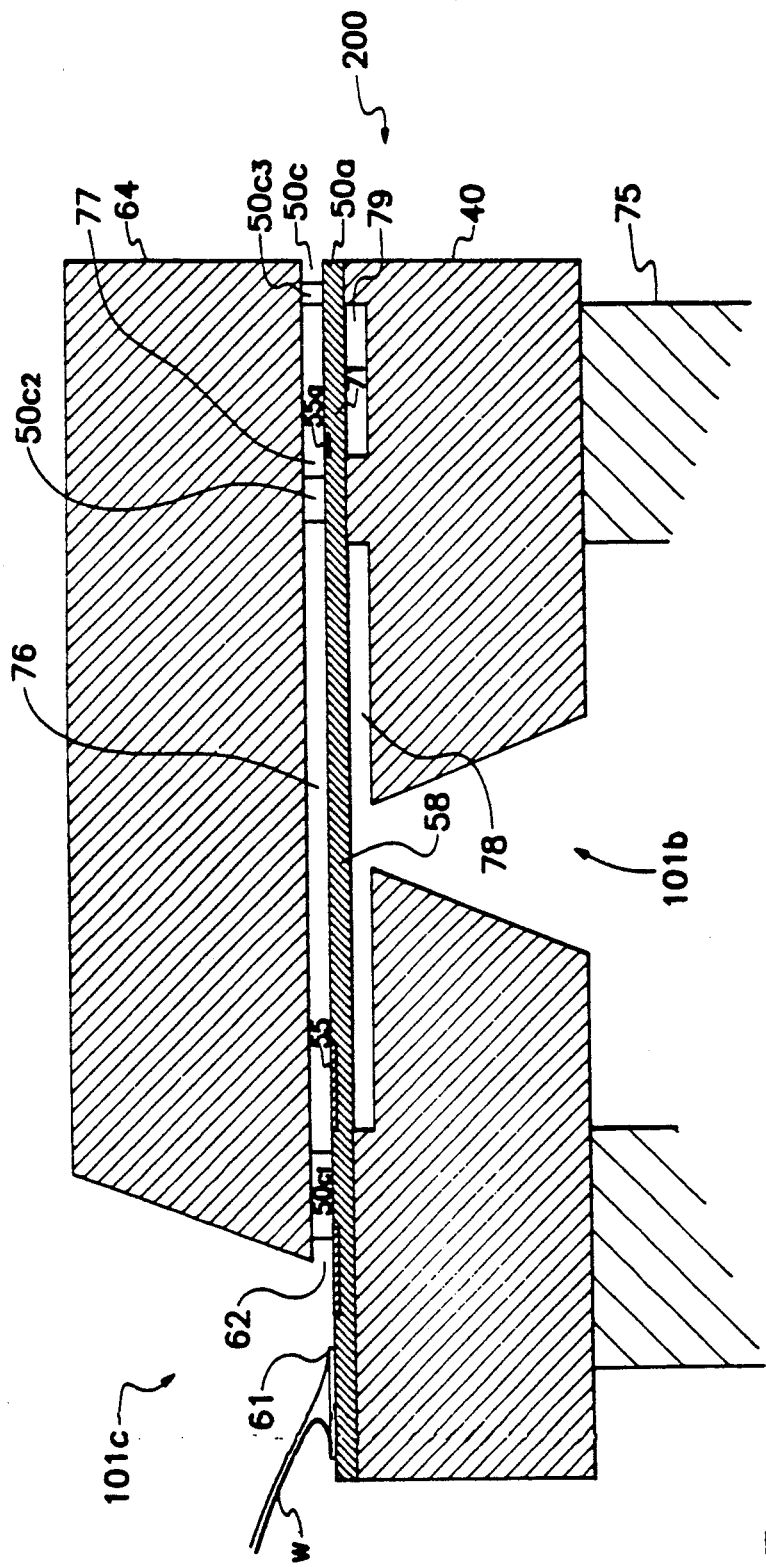

FIG. 5 is a drawing of a cutaway side-view of a two-diaphragm sensor which is mounted onto a glass or Pyrex tube.

Figure 7:
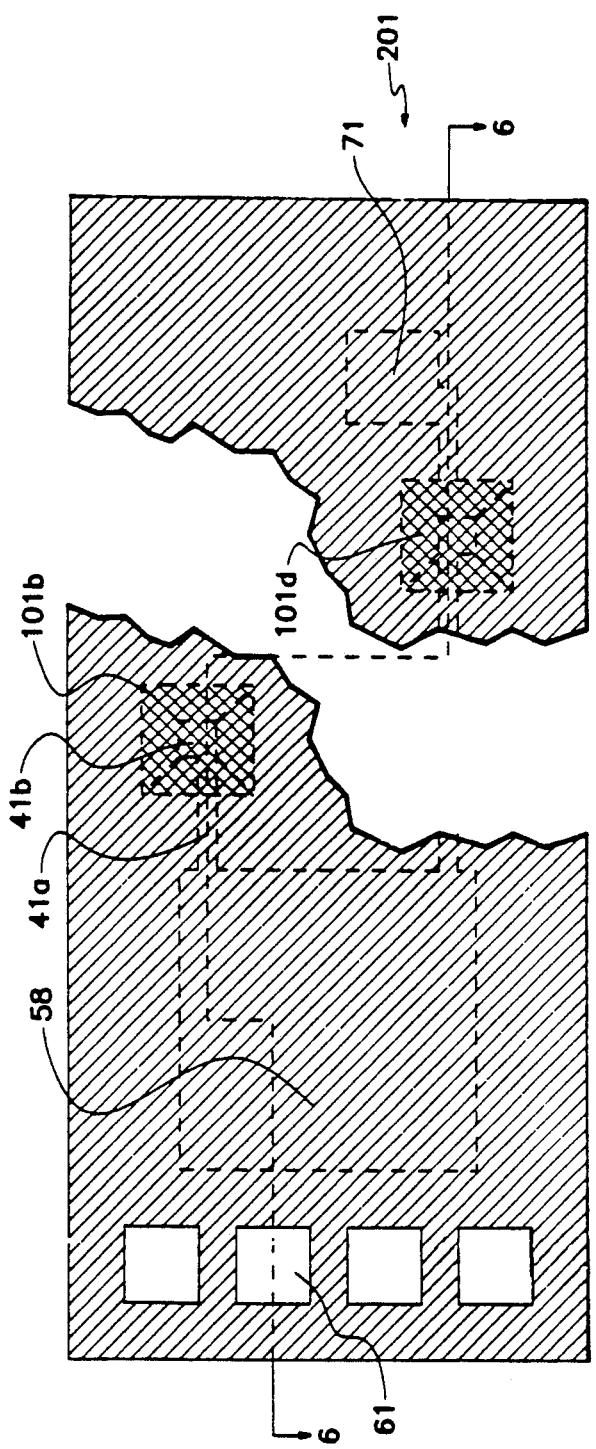
Figure 6:
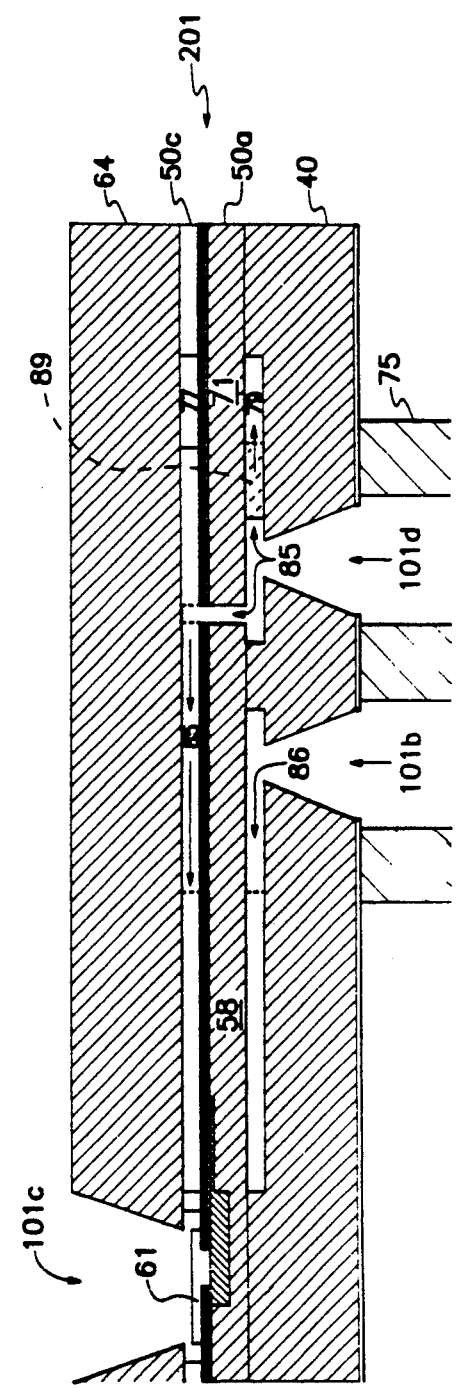

FIG. 6 is a drawing of a sectional side-view of a two-diaphragm sensor having alternate ingress and egress passages to the diaphragms, taken at device 6—6 of FIG. 7.

FIG. 7 is a top-view of the sensor of FIG. 6.

Figure 8A:
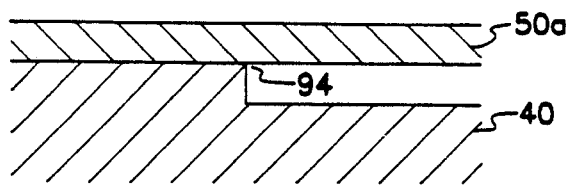
Figure 8B:
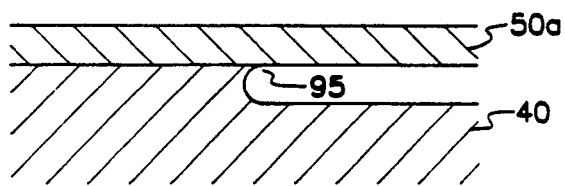

FIGS. 8a and 8b are partial side-views of the angle made by the diaphragm layer where bonded over a cavity.

Figure 9:
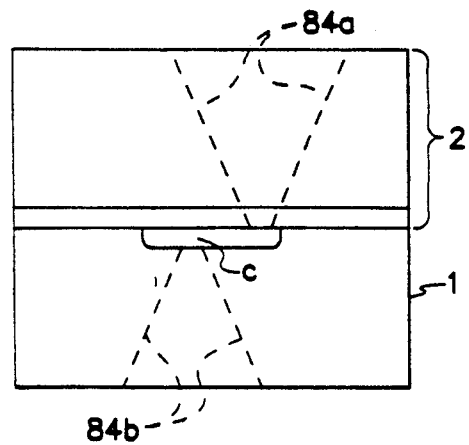

FIG. 9 is a side-view of an alternate embodiment wherein the backfill material is included after etching an access port.

Figure 9A:
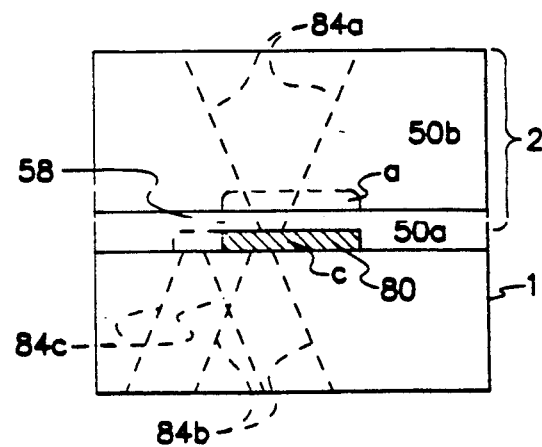

FIG. 9a is a side-view of an alternate embodiment having the cavity in the diaphragm layer.

Figure 10:
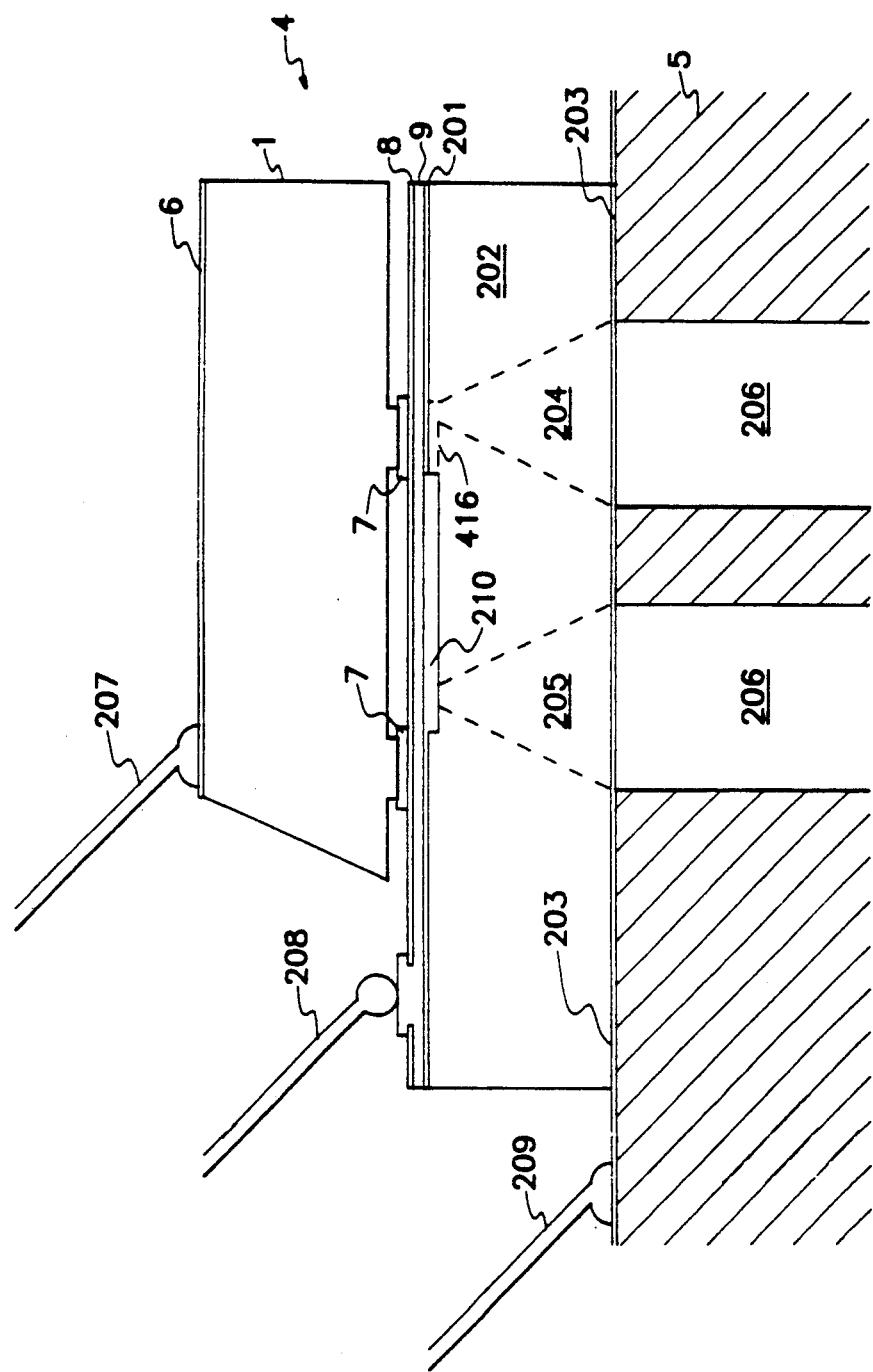

FIG. 10 is a side-view of a capacitive diaphragm sensor design.

SUMMARY OF THE INVENTION

Two primary techniques were developed in response to the problems in constructing a reliable and consistent diaphragm microstructure. Both of these depend on the use of a backfilled cavity, preferably filled with oxide, during the early processing steps. (As mentioned in the background section, construction of similar microstructures may also be accomplished using only electrostatic bonding without backfill in cases where damage to the diaphragm is unlikely.) In both backfill cases, the cavity below where the diaphragm will be placed is filled to the level of the diaphragm before the diaphragm wafer is mounted on and bonded to the wafer having the cavity. Further, in sensors where access ports would be used to provide access through the backfilled cavity, the backfilling is preferably done before access ports (to the diaphragm) are formed. The backfill material can also provide an etch stop for the formation of the ports, allowing high precision diaphragms to be formed.

The use of the process described below provides a way to make some novel structures as well.

The detailed description provides the process.

DETAILED DESCRIPTION OF THE PREFERRED EMBODIMENT

This detailed description is presented to enable any person skilled in the art to make and use the invention, and is provided in the context of a particular application and its requirements.

Various modifications to the preferred embodiments will be readily apparent to those skilled in the art, and the generic principles defined herein may be applied to other reasonably apparent and useful embodiments and applications without departing from the spirit and scope of the invention. Thus, the present invention is not limited to the embodiment shown but is intended to be accorded the widest scope consistent with the principles and features disclosed herein.

Figure 1:
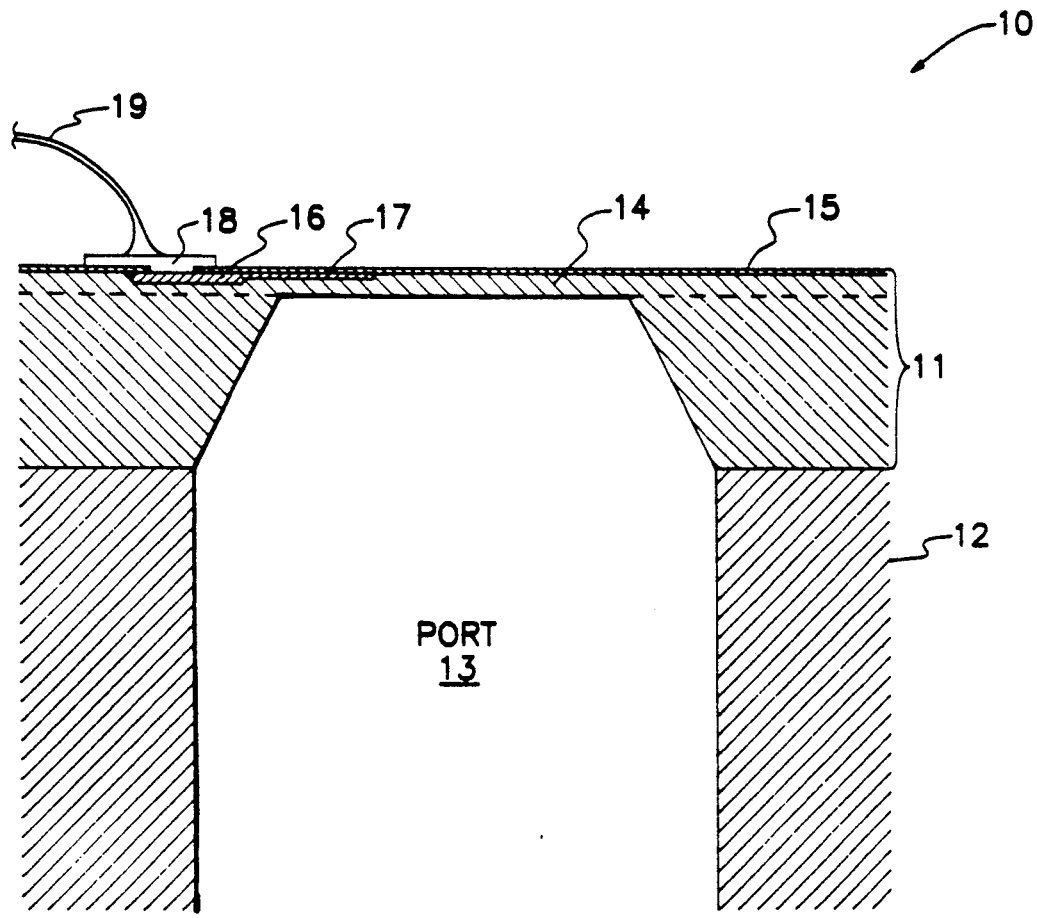
FIG. 1 is a prior art pressure sensor, having no overpressure protection.

In FIG. 1, a prior art device 10 is shown constructed of a single piece of silicon 11 cemented to a Pyrex (or other glass or similar material) port tube 12 containing port 13 which provides access to the diaphragm 14 for the fluid being measured or tested, such as ambient air, silicone oil or other relevant fluid. An insulating layer 15 provides protection against deterioration of the diaphragm and electrical features therein. The delta regions 16, 17, change electrical characteristics with the bending of the diaphragm 14. These changes can be measured by connection of region 16 through pad 18 to an electrical lead 19 which in turn may be connected to interpretive circuits, commonly employing devices such as Wheatstone bridges, in the case of resistive sensors. (These interpretive and other related circuits are not the subject of this invention and are not shown.) The delta regions 16, 17 may be formed by doping the surface of the sensor or through other methods to provide the electrically sensitive structures with different properties from those of the rest of the diaphragm. Neither the details of the patterning of these electrical structures nor of their formation are shown as there are numerous methods and structures, many of which are well known to the ordinary practitioner of that art.

FIG. 6 is a side view through one of the finished sensors 201 built using the processes taught herein. Note that three potential ports types 101b, 101c and 101d are available, providing access to the diaphragm from the top, bottom, or "off-axis", meaning off to the side. On-axis ports, meaning centered with respect to the diaphragm, for either the top or bottom are possible also. Port 101c in this case also provides access to bonding pads 61 for bond wires (not shown) which may be inserted therethrough and connected to pads 61.

Starting with the basic building block, a standard polished silicon wafer (not shown), is first subjected to heat in the presence of oxygen (or steam) to grow an oxide layer of *approximately* 200 Angstroms to 1.4 micrometers. (Of course, if working with another material beside silicon wafers, analogous materials for analogous purposes should be used in this process.)

Figure 2A:
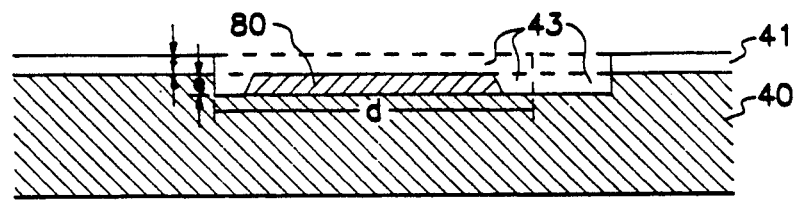
FIGS. 2a–j are a series of side-view drawings of the wafer processing steps which produce the diaphragm sensors of the preferred embodiment.

Atop the oxide layer, a nitride layer may also be deposited, providing some flexibility in the use of different etchants if desired. Referring to FIG. 2a, the oxide layer 41 is shown above wafer 40, and above it could be nitride layer 44 (not shown).

The oxide covered wafer should then be patterned. As used herein, and as is commonly used by those practiced in this art, "patterned" means: applying photoresist to the oxide coated surface, prebaking the photoresist, aligning the wafer with a photomask, exposing the wafer through the photomask, developing the photoresist, baking the wafer, etching away the surfaces not protected by the photoresist, and stripping the protected areas of the photoresist so that further processing can take place.

Currently, this type of patterning technique is common in the manufacture of integrated circuits and microstructures. As analogous methods may be developed, they may be substituted without departing from the inventive concept described in this patent.

At this point in the processing, two alternative methods may be used to achieve satisfactory backfilling; Low Temperature Oxide and Thermal Oxidation. (Note that where an oxide is called for it is generally a silicon dioxide, and where a nitride is called for it is generally a silicon nitride. In cases where a layer of non-silicon materials is used, the oxide or nitride may be another material, but silicon nitride and silicon dioxide are preferred.

The Low Temperature Oxidation (LTO) Backfill Method.

Referring again to FIG. 3a, a cross section of such a patterned wafter 40 is shown, having the oxide layer 41 remaining over the areas not etched. Note that with this LTO method, a cavity 43 has been patterned and etched into the silicon wafer itself. This may be done with an etchant which etches both oxide, nitrides and silicon crystalline structures in one step after patterning, or it could be done using multiple liquid or dry (plasma) etchants.

The etched cavity 43 has a channel 41a at its side. The cavity and the channel connected to it forms the basic structure of this particular pattern, but many variations could be used. Having such a channel allows for access to this cavity from a location away from the transverse axis of the diaphragm in the finished product. The channel 41a is more clearly visible in FIG. 2j.

The cavity 43 and channel 41a may be heavily doped with boron if desired, to serve as an etch stop later in the process. Other etch-stop materials may be easier to work with, including thermally grown $SiO_2$, LTO, LPCVD (Low Pressure Chemical Vapor Deposited) silicon nitride or sputtered silicon nitride, but using these materials requires patterning.

Figure 3A:
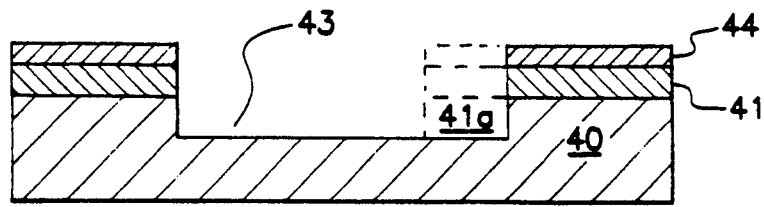
Figure 3B:
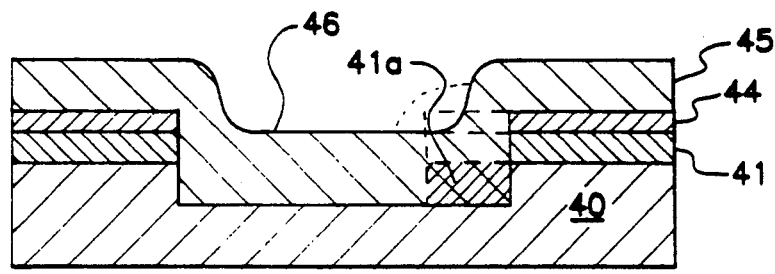

Having accomplished the processing described with reference to FIG. 3a, low temperature oxide (LTO) is now deposited onto the surface of the wafer having the recess. Again, in FIG. 3b, the substrate wafer 40 is shown having an oxide layer 41 and a nitride layer 44. On top of this is deposited the low temperature oxide 45. This deposition can occur through a gaseous reaction or by sputtering. Note that at a typical thickness of 10,000 Angstroms, there is normally approximately a ten to twelve percent variation in thickness of the LTO. This is different from high-temperature oxidation processes where a very flat and smooth surface has thickness variations of less than 1%. Note that the upper surface of this low-temperature oxide 46 may exceed the depth of the cavity etched into the silicon wafer 40.

Figure 3C:
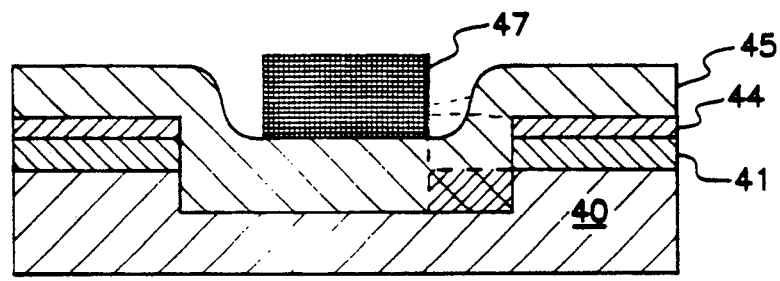

After deposition of the LTO, a pattern of photoresist may be applied to protect the portion of the LTO which will be the backfill. In FIG. 3c photoresist 47 is shown covering a portion of the low-temperature oxide 45.

Figure 3D:
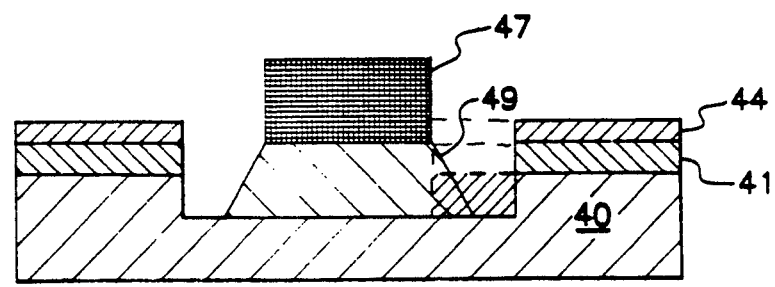
Figure 3E:
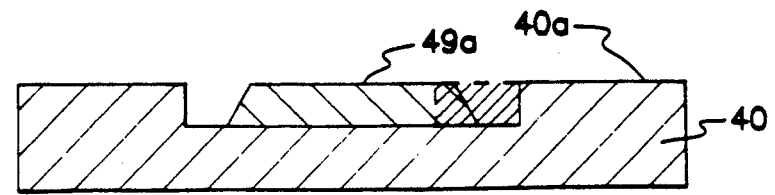

With the exposed photoresist remaining in place over the recessed regions, a buffered oxide etch is used, leaving only protected oxide backfill 49, having removed the non-protected LTO, as seen in FIGS. 3c and 3d. Substantially all of the low-temperature oxide with the exception of that protected by the patterned photoresist is removed.

Where nitride is used, the nitride is next etched with a selective dry etchant. Next the "field" oxide (oxide which was originally grown to cover the entire wafer layer 41), is removed. The photoresist should then be stripped.

It should be noted that it is important that the height of the surface of the wafer 40, 40a (FIG. 3e) be equal to or greater than the surface of the remaining low temperature oxide 49, 49a.

Several ways are available to accomplish such leveling. A wet etchant which etches the oxide but not the silicon can be used for a short period of time until the proper height is achieved in the preferred embodiment, although mechanical abrasion or polishing may be used.

The Thermal Oxidation Backfill Method

Figure 4A:
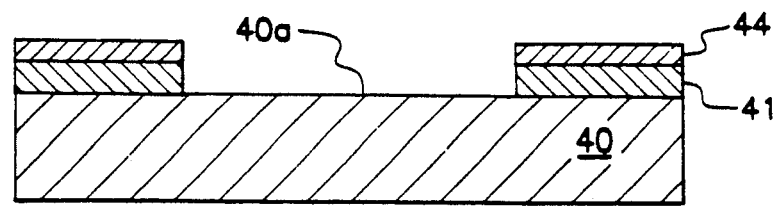
Figure 4B:
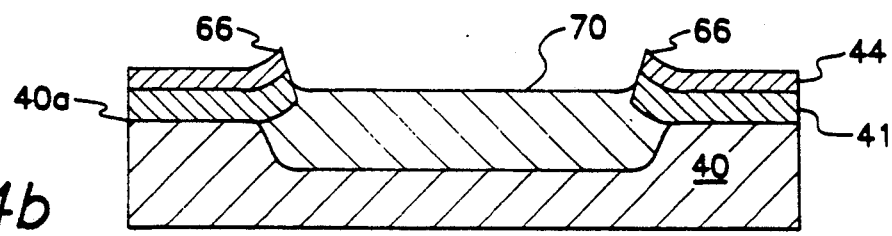
Figure 4C:
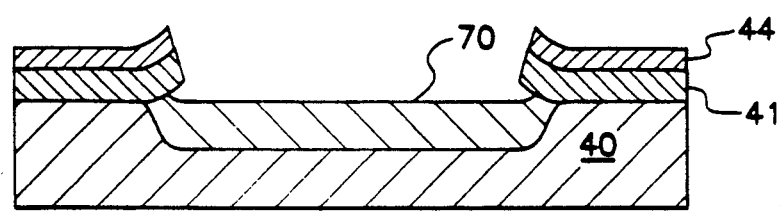

An alternative method to low-temperature oxidation which provides acceptable backfill, is the thermal oxidation technique. Referring first to FIG. 4a, it can be seen that the initial processing steps as described above are followed, however after pattern removal of the oxide layer 41 (and the nitride layer, if any, 44), there is no etching into silicon substrate 40. Instead, heating the silicon wafer 40 in the presence of oxygen or water vapor (steam) will cause an oxide 70 to form, at once expanding above and below the line of the surface 40a of the silicon wafer.

Where a nitride layer 44 has been applied, the newly grown oxide 70 may be produced without increasing the thickness of the oxide underlying the nitride layer (except at the edges near the cavity). As in the LTO process, the channel may be patterned and doped with boron, if desired. Note the formation of a ridge or "bird's beak" 93 (FIG. 4b) at the edges of the oxidized cavity. These ridges 93 can, if not removed, destroy the changes of having a flat or otherwise successful diaphragm.

The nitride layer is much preferred for the high temperature oxidation process. It provides additional control in establishing appropriate cavity depth or height of the backfill layer.

Figure 4D:
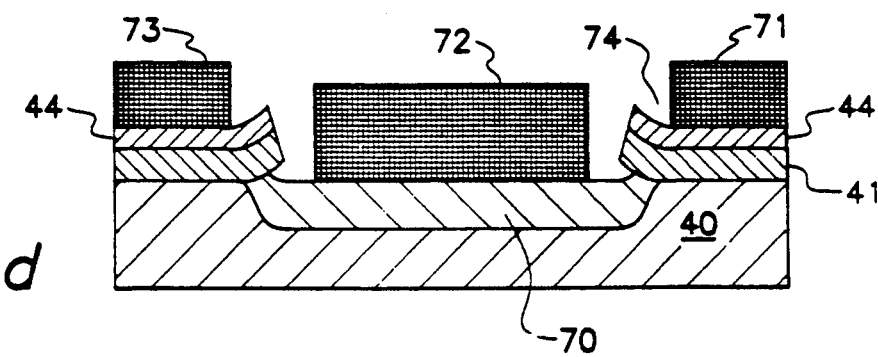
Figure 4E:
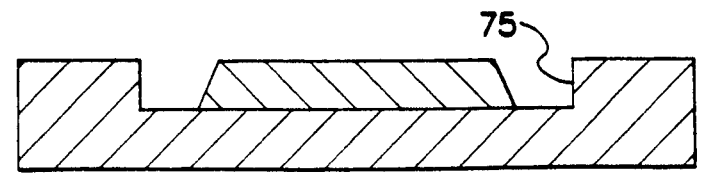

The next step in the process is illustrated in FIG. 4d in which the wafer 40 is again shown, having the oxide 70 and the field oxide 41 grown earlier. As shown here, the silicon nitride layer 44, 74 could be used and left, before applying the photoresist 71, or stripped off as on the opposite side of the drawing under photoresist portion 73. It depends on the desire of the user of this invention, whether a selective dry etch for removing the nitride should be applied first, or whether an etch which will strip both the oxide and the nitride at the same time will be used. Accordingly, in the drawing under the part of photoresist labeled 73, no nitride is shown. It should also be noted that the "bird's beak" ridge 93 surrounding the cavity area caused by the upgrowth of oxide is removable in this process. The patterning and etching to produce a trench where the ridge was found to be a most satisfactory solution.

Pattern photoresist elements 73 and 71 are also applied in this thermal oxidation process and are unnecessary in the LTO process. (There is, of course, no substantial cost for these additional photoresist elements.) When an oxide etch is applied to the structure illustrated in FIG. 4d, an etchant may be used which facilitates the etching of a wall (side wall 75, FIG. 4e) in the silicon 40. The application of elements 71 and 73 of the photoresist, allow for the introduction of an etchant to remove that part of layer 41 adjacent the interior edges of 71 and 73. The side wall 75 preferably has an acute upper angle (or overhang) or is vertical or inwardly rounded (see FIGS. 8a and 8b, angles 94 and 95 for illustration of preferred angles).

Note that in the FIG. 4 series, the structure indicating the location and existence of a channel, 41a, is not shown. This is to enhance the understanding of the process by simplifying the drawing and not to indicate that no channel is constructible using a thermal oxidation process. The illustration of the construction of such a channel through the use of cut-away views would be merely confusing. Likewise, in the FIG. 2 series of the FIGURES, the backfill is not shown in the channel at all to give the channel greater visibility, although it is preferred that the channel be backfilled as well: See discussion regarding FIG. 7 for more detail.

Diaphragm Sensor Construction Following Backfill Procedures

Figure 2B:
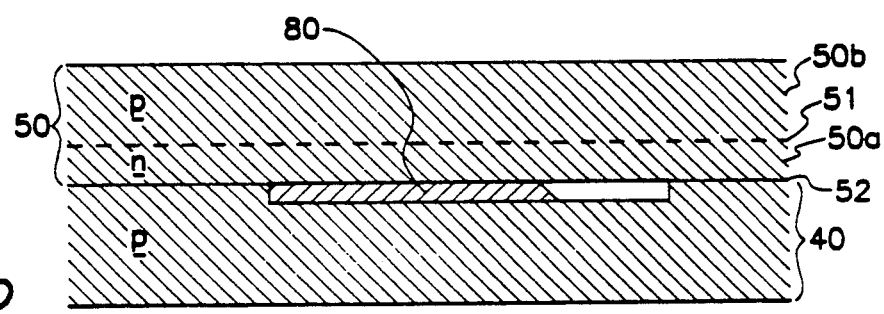

The next step in the process is to provide for the placing of the diaphragm material over the backfilled cavity. It is generally accomplished using a second wafer 50 which is of 'n' or 'p' type material to which an epitaxially grown layer of 'n', type material is grown. In FIG. 2b, dotted line 51 indicates the border between the 'p' and the later grown 'n' type materials of a wafer 50. Wafer 50 in the drawing is shown lain across (at line 52) wafer 40, which is composed of 'p' type material. The backfilled material 80 can be clearly seen in this FIGURE.

It may be useful at this juncture to suggest what relative sizes the component parts of this structure are. In FIG. 2a, length 'd' is approximately between 60 and 2000 microns, 'f' on the order of 400 to 14,000 Angstroms, and 'e' on the order of 0.5 to 5 microns. The epitaxially grown layer ('n') is approximately between 5 and 80 microns.

For further processing, wafers 50 and 40 are heated together to approximately 1100 degrees for approximately 1 hour. It is well known that applying significant heat to two wafers of silicon with substantially planar surfaces will form a bond between the wafers. The mere touching of the two wafers together as is suggested in U.S. Pat. No. 4,638,552 does not produce a satisfactory bond, even where the surfaces of the wafers are polished. It has long been known that significant bonding strength increases with higher heat and pressure but that silicon begins to melt around 1400° Centigrade, and deformation may occur well before 1400° is achieved. The addition of backfill material 80 into the structure, provides significant protection during subsequent high temperature processing cycles.

A preferred bonding technique uses treatment of the surfaces to be bonded to make them hydrophyllic (using, for example, a liquid cleaning process containing an acid such as "RCA Clean", which is commonly known in wafer processing art, similarly, things like $NH_4OH$ and $H_2O_2$ in water could be used), contacting the two wafers and annealing them at a temperature of between about 600°-1200° Centigrade.

Figure 2C:
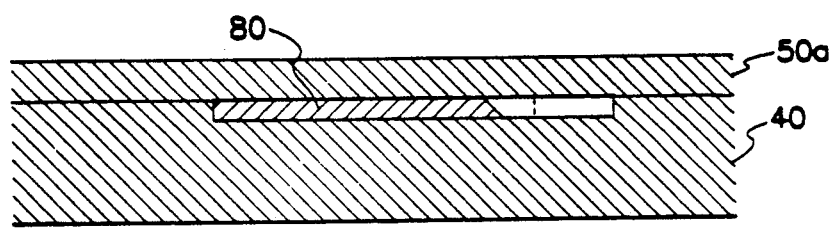
Figure 2D:
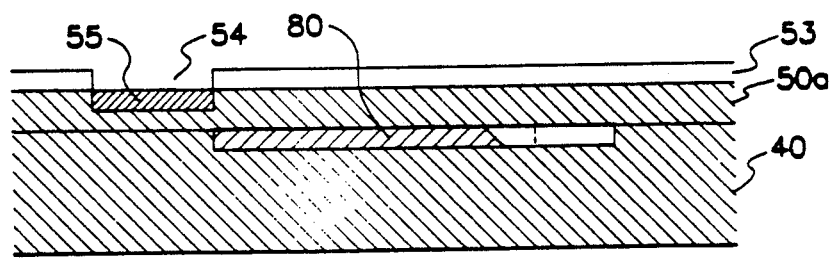

The 'p' material of wafer 50, now joined to wafer 40 is next stripped away, leaving a layer of 'n' material fused to a layer of 'p' material as illustrated in FIG. 2c. As is often the case, this layer 50a requires polishing, a step which can damage or distort the diaphragm without the presence of backfill material 80.

Use of 'p' materials or 'n' materials may be switched, or all 'n' or 'p' could be used if a selective etchant is used to thin the wafer down to the epitaxial layer. The use of particularly electrically characterized materials is merely to illustrate a preferred embodiment. It is also possible to dope an entire wafer and reduce it to the needed size. Polishing may then be used too, to reduce the wafer thickness.

An oxide 53 (FIG. 2d) is then applied to surface layer 50a. Layer 53 is next patterned and etched to provide a removed region 54 through which boron material 55 may be implanted or diffused into layer 50a at the region 55. Patterning and etching again, and removing section 57 from layer 53 allows for the additional doping indicated at area 56 in FIG. 2e. Doped areas 57 and 55 will provide both the piezoresistive sensor areas and the electrically conductive pathway to the sensor areas, respectively in what is now the nascent diaphragm 58. Although region 55 is shown thicker than region 57, this is meant only to indicate region 55 is more strongly doped, not that it is deeper, although that may be true.

These implants are activated and a thin layer of oxide grown followed by depositing a passivating layer such as silicon nitride or phosphorus doped glass layer 59 (FIG. 2d) atop n-layer 50a.

There are numerous other method steps and devices which could be used for constructing the electrical structures atop the nascent diaphragm, but the method described here, including adding protective layers have been found to be satisfactory and the best mode for doing so. The inventive claims should not be limited to the electrical features described or the described method of creating them.

For example, where an engineer of ordinary skill in this art desires to construct a capacitive diaphragm sensor, obviously the use of the herein described backfill technique would be useful to protect the diaphragm.

For an explanation of how this structure would look, refer to FIG. 10 in which a capacitive sensing device 4 is shown having a three-wafer design bonded to a pressure tube 5. Wafer 1 has a metallization layer 6 at the top and is bonded, preferably with a bonding film such as a thin-film Pyrex bond or glass frit or epoxy or gold eutectic 7, to a dielectric layer 8 which forms an upper surface of the diaphragm layer 9. Under the diaphragm layer is another thermal oxide layer 201 which is, preferably, fusion bonded to wafer 202. Between wafer 202 and the tube 5 is another metallization layer 203. It is preferable to have an off-center pressure port for this construction 204 (leading through access passage 41b to cavity 210), although an on-center pressure port 205 leading to access pressure port 206 would also be acceptable. For the capacitive sensor 4, at least three electrical contacts to the relevant layers are required. As shown in FIG. 10, these are 207 to the upper metallization layer 6, 208 to the epilayer 9, and 209 to the metallization layer 203.

Because the removal of the backfill oxide material removes the insulating layer between layer 9 and wafer 202, for some uses of this capacitive sensor, it would be required to coat cavity 210 or the undersurface of layer 9 with a dielectric material that will not respond to the oxide etchant. (Therefore, one could simply not backfill, or could use a selective etch technique to remove the backfill, or use a different oxide than used for layer 201 if so desired.)

Figure 2E:
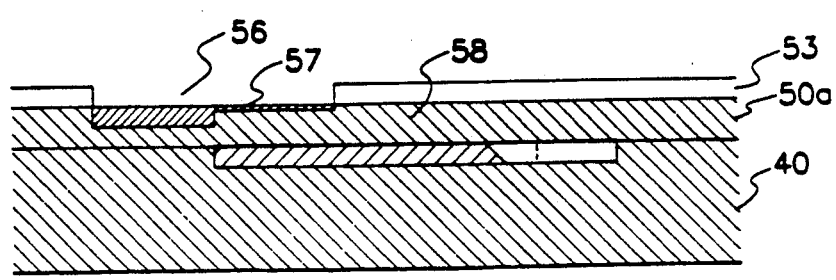
Figure 2F:
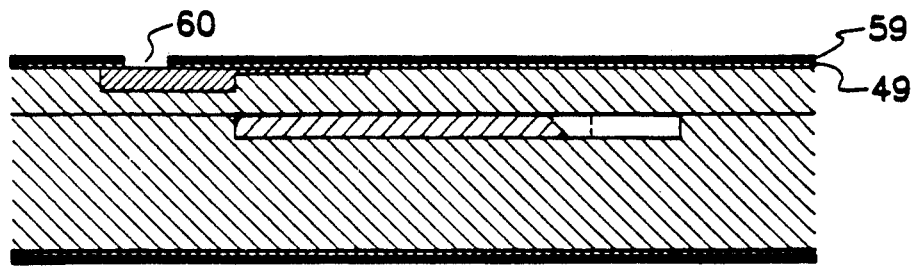

Referring now to FIG. 2e, the oxide layer 53 is removed by etching. The surface is then covered with an oxide or other dielectric layer 49, and again covered with a nitride or phosphorus doped oxide layer 59 (FIG. 2f).

Figure 2G:
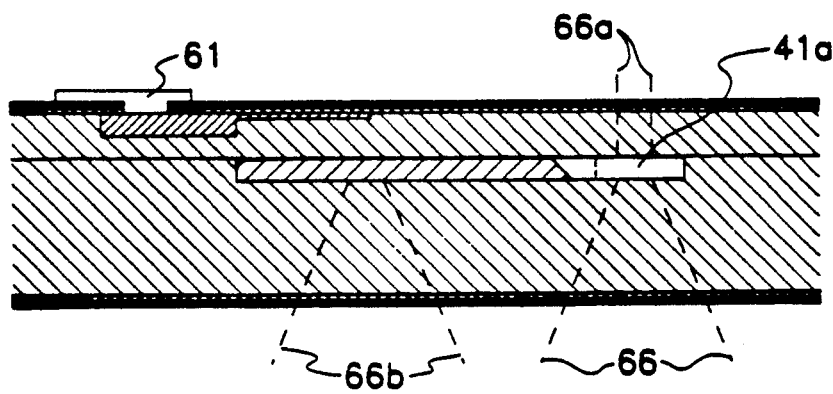

FIG. 2g illustrates possible locations for access ports to passage 41a, i.e., passages 66 and 66a. On-axis ports could also be used as, for example, the one illustrated by dotted lines 66b.

Several preferred metals can be used to build bonding pads such as pad 61 shown in FIG. 2g. Copper, aluminum and silicon alloy, or the formation of platinum silicide followed by a stack of TiW/Au/TiW or Ti/Pd/Au, which is then patterned with photoresist and delineated (etched with a series of metal etches which are known to those of ordinary skill), are all reasonable alternatives which may be used. These described metals and build steps are believed to be acceptable, but the reader may choose others without going beyond the scope of this invention. Various techniques which are well known to those of ordinary skill may be used to build the pad from these or similar materials. The device may be considered completed for some uses at this stage.

As shown in FIG. 2g, this diaphragm containing structure could be used with minimal further processing. By etching the back-side at the area indicated by lines 66 and then removing the backfill material with an oxide etch, a simple diaphragm structure with an access port would be obtained. However, even further processing may be done with the backfill supporting the diaphragm 58.

Figure 2H:
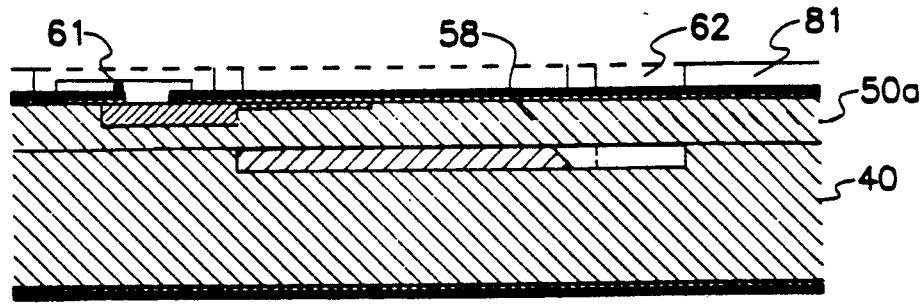
Figure 2I:
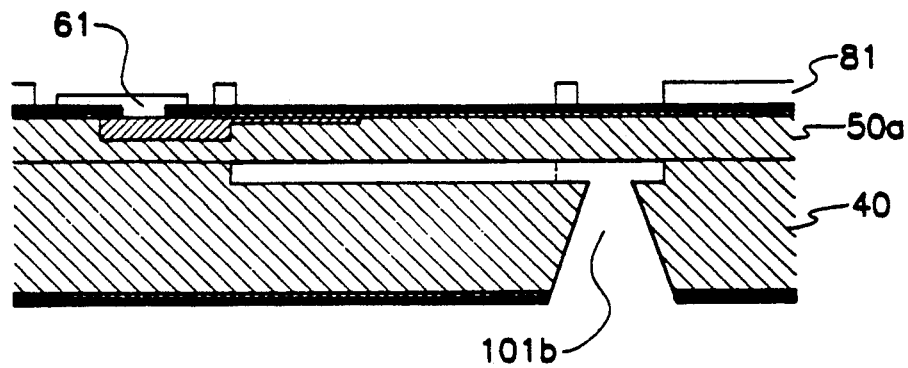

Referring now to FIG. 2h, the wafer 40 has the diaphragm layer 50a (with nascent diaphragm 58) bonded atop it and a layer of Pyrex glass 81 is sputtered atop layer 58. However, it should be noted that it is possible to perform this step on a wafer (not shown in FIG. 2h) which will be bonded above the diaphragm 58 in the three or more wafer design. The purpose is to allow for normal deformations of the diaphragm and sensor during use and to separate from and bond the diaphragm layer to the next wafer. It may be equally preferable to sputter the Pyrex to the upper wafer instead of to the lower layer. Also, Pyrex glass is not a required material. Other materials with similar properties may be used, such as a borophosphosilicate glass, glass frit or a gold eutectic would work, for example. (Pyrex is a trademark of Corning Glass Company.)

It is preferable to preprocess a third wafer (64, FIG. 2j) to form ports such as 101a and 101c before aligning and thermoelectrically bonding wafer 64 to the Pyrex or other material layer 81. The usual method for etching any port is anisotropic etching.

Whichever wafer (top 64 or bottom 40, 50a) the Pyrex (or similar suitable material) layer is placed, the preferred bonding method is thermoelectric. That is, the wafers are aligned and contacted, then a current is run across the interface in the presence of mild heating. The ordinary practitioner of wafer fabrication art will recognize that raising the level of the current, the time, or the heat applied, will lower the need for the other factors to produce a satisfactory bond strength. Similarly, changes to the materials will require changes in the bonding technique. For example, where a thicker layer of Pyrex or similar material is used, more time, current or heat will also be required. A good reference for this type of bonding is found in "Sensors and Actuators" A21-A23 (1990), 931-934, in the article "Low-Temperature Silicon-to-Silicon Bonding with Intermediate Low Melting Point Glass" by Egashi et al of Tohoko University, Sendai, Japan. At the present time, wide variations in voltage levels (15-400 volts, mainly depending on the thickness of the Pyrex or other material in layer 81) seem to produce acceptable bonds when heating to substantially less than 600° Centigrade. It is preferred to perform this bonding in a vacuum, but not required.

Alternatively, wafer 64 could be bonded to the layer 81 first, provided it is doped at bottom with boron. An anisotropic etchant such as potassium hydroxide may be used to remove the silicon and stop on the heavily doped boron layer in wafer 64 (not shown) on the order of two microns thick. Isotropic etching may be used to remove the oxide backfill. If used, the boron doped layer (which may also be in wafer 40 if desired) is removed using a plasma etch and the backfill material 80 is then removed by a selective etchant like hydrofluoric acid. This is done through the lower port 101b, leaving a channel 41a (FIG. 2i) to the underside of diaphragm 58. (Remember, for convenience, the oxide backfill 80 is not shown in this channel but it is removed from the channel during the etching process.) A top view can be seen in FIG. 7, where the backfilled oxide region is that outlined by dotted lines in the regions indicated by numerals 58, 41a, and 41b, and the region at 41b provides the etch-stop for port 101b (when 101b is etched prior to etching the backfill).

Many variations on this process are possible. For example, absolute pressure sensors are readily made with slight modification, for example, by starting with the backfill removal structure of 2i and sealing the lower port; alternatively, by building the structure without backfill. A pressure reference therefore exists in the lower recess immediately below the diaphragm. Alternately, all processing steps leading to the structure 2j, but not employing backfill and omitting only the formation of pressure port 101a, will also produce an absolute pressure sensor, with the pressure medium fluid applied to the bottom of the diaphragm rather than the top.

An obvious alternative would also be to build on-axis ports, thereby omitting the need for pressure channels such as 41a, since the port would open directly over or under the diaphragm (port 205, FIG. 10).

Figure 2J:
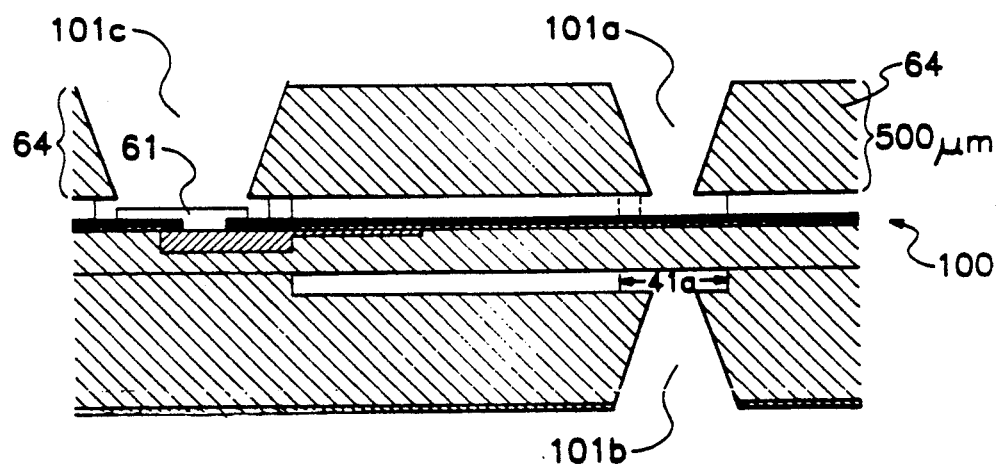

Differential pressure transducers with coplanar ports require one additional patterning and etch step to the above process sequence to form a small pressure access port in the diaphragm layer 50a in an area similar to that indicated by dotted lines 66a in FIG. 2g (obviously, patterning and etching the protective layers 58 and 59 first, over that area indicated). It should also be clear that the length of the channel 66b would be larger than shown so that the port is far enough from diaphragm 58 to avoid affecting it in an undesired manner. Where the pressure port or access port is desired to be located directly over or under the diaphragm 58, variations in the process will allow that as well. For this to occur, structures like channel 66b or 41a need not be etched into silicon wafer 40, and the location of the access port need merely be moved with respect to the location of the diaphragm.

Where only wafer to wafer alignment capability is available (such as that obtained by aligning wafers by hand), on-axis pressure port alignment or something close to it may be necessary since it may not be possible to align the pressure port with the very small channels such as channel 41a (FIG. 2j). However, with infrared aligners and use of preprocessed and micromachined cover wafers, other configurations become possible and favorable for development. For example, prefabricated piezoresistors in the center wafer (diaphragm layer 50a) may be made prior to the bonding step, followed by aligning, bonding, and etch-back procedures.

Description of Novel Structures.

With the invention of adequate processing capabilities for building multilayer pressure sensors such as described above, absolute pressure sensors with built in pressure references, and sensors with effective overpressure protection stops may be built. Generally, overpressure protection is provided by building the cavity such that the depth allows for deformation of the diaphragm but not so deep that the diaphragm may stretch or break when forced under substantial pressure against the bottom of the cavity. Thus, with a diaphragm of about 5 to 80 microns in thickness, a cavity such as that described with reference to FIG. 2a would be desirable.

Differential devices with one-sided or two-sided overpressure protection are easily made. Off-access ports allow a multiplicity of gage, differential, and static transducers to be cofabricated. This can be used to build higher and mixed functionality, redundant designs, such as fault tolerance through multiple redundant structures. Other functions include self testing, extended range, self calibration, slow and fast dynamic responses in one device if desired, and built in reference transducers. Using the above-described processes, it is possible to construct devices sensitive to less than 0.1 psi or 500 Pa and devices sensitive to greater than 3,000 psi (200 MPa) simultaneously on the same die or in neighboring cells on the same wafer. Off-axis ports offer additional versatility in packaging, making available both opposing and coplanar pressure ports having access to the same diaphragm or multiple diaphragms. Further, the pressure ports can be completely isolated from the electrical leads, reducing the constraints on the pressure transmitting medium and the electronics housing for a complete sensor device. As an alternative to piezoresistive sensing, capacitive sensing may be used with slight modifications (see FIG. 10 and related discussion for example). Electrostatic excitation of the diaphragm plate element (to excite resonances in the plate which are pressure dependent) can be added for self-checking or self-calibration with or without a reference pressure sensor.

Referring now to FIG. 5, a device 200 is shown having a diaphragm layer 50a, a separation layer 50c, a base wafer layer 40, and a superstructure wafer layer 64. The base wafer layer 40 is attached to a pyrex tube 75, although any similar structure could be used. An access port 101b is centered on the axis of diaphragm 58 and provides ingress and egress of relevant fluid to the lower surface of diaphragm 58. A wire w is bonded to pad 61 at location 101c to provide electrical contacts to the electrical structures within layer 50a.

Electrical structures within layer 50a include at least piezoresistor 55 and piezoresistors such as resistor 55a over diaphragms 58 and 71 respectively. A multiplicity of piezoresistors are typically formed in diaphragm layer 50a to form fully active Wheatstone bridges. The Pyrex layer 50c manifests itself in the cross-section of FIG. 5 as $50c_1$, $50c_2$, and $50c_3$, each providing a portion of the isolating structure which defines cavities 76 and 77 (or upper recesses). The device 200, therefore, can function (assuming multiple wires connected to multiple bonding pads, connected to the multiplicity of piezoresistors (such connections are not shown)) as a pressure sensor having an absolute reference. Thus, diaphragm 58, exposed through port 101b along the internal area of tube 75, and also to pressure applied through port 101c and formed pressure channel 62, will bend in response to pressure differences between the cavities 76 and 78. Diaphragm 71 deforms with applied pressure through either pressure applied to the upper recess 77 through upper pressure channels 50c, or with applied pressure, applied to recess 79 through lower pressure channels (which could exist in a different structure).

An additional advantageous feature of using the Pyrex (or substantially similar material, like a glass) layer $50c_1$, $50c_2$, and $50c_3$ can be illustrated with reference to this embodiment and the one illustrated in FIG. 6. Here, two access ports, 101b and 101d, are shown allowing the relevant fluid through tube 75, through passageways 85 and 86, to both sides of diaphragm 58. By making a very slight variation, access pathway 85 can go into cavity 79 through dotted area 89 or through pathway 85 into cavity 77. Thus, the flexibility and variations available using this process are adequately illustrated. By virtue of the location of tube 75 away from diaphragm 58, the differential between the thermal coefficient of expansion of the tube 75 and the diaphragm 58 may not cause any damage or false readings from diaphragm 58. The use of a thick silicon upper wafer 64 also adds to this feature. The diaphragm may be accessed from the same-side ports or from ports on opposite sides, may be accessed from a port on one side only, or may receive relevant fluids from both sides. Likewise, the reference diaphragm 71 may receive reference fluid access or access to the same fluid being received by the measuring diaphragm 58.

A top view of the construction illustrated in FIG. 6 is illustrated in FIG. 7 for perspective.

It should be noted that a third backfill technique may be employed, oxidizing by thermal oxidation the cavity *after* it is covered by the diaphragm layer. In this process, the creation of the cavity in the substrate would occur first, then the second wafer would be bonded over this cavity to the first wafer. An access passage or port would then be etched into one of the wafers so that access to the cavity was obtained. Subjecting this structure to heat in the presence of oxygen would allow for the formation of oxide. It would be preferred to heat it to about 1100° Centigrade for about an hour to substantially fill the cavity with oxide. The second wafer can then be reduced in thickness to produce the diaphragm, and normal processing as described above would then occur.

FIG. 9 shows such a structure having a first wafer 1, a second wafer 2, with an epitaxially grown layer n bonded above cavity c. The etched port could be through either wafer 1 or 2, as shown by dotted lines 84a and 84b. After thermal oxidation, the p layer would then be removed, leaving a structure similar to those of the FIG. 2 series.

Another alternative processing method and structure is also available and can be seen with reference to FIG. 9a. In this alternative, the diaphragm layer itself is used to contain the cavity c on one side of the nascent diaphragm 58. After backfilling it, through any of the aforedescribed processes (and bonding to wafer 1 before or after backfilling c with backfill material 80), the substrate material 50b is removed, leaving the diaphragm layer 50a having both a backfilled cavity and a diaphragm above it. The backfilling may be removed through access ports 84b or 84c for on and off-axis access, respectively, or through 84a, for another example. A cavity d may be included in an upper wafer bonded later to layer 52, or such a cavity d may be created in a layer like layer 81 of FIG. 2h for example. Other process variations more explicitly described in the previous section may also be used to produce this diaphragm layer with cavity structure.

Like numerals in different FIGURES refer to like structures. Numerous variations of the structures identified above as well as the processes described above will occur to the artisan of ordinary skill in this art. However, the scope of this invention is only limited by the following appended claims.

Preferred Embodiment Thermo-Electric Bonding

We believe it preferable to sputter a borosilicate glass containing mobile cations and having a thermal expansion coefficient similar to silicon. Because of the high cost of sputtering thicker layers, we prefer to sputter as thin a layer as possible. Currently, 1 micron thickness is preferred. At this thickness, with some diaphragms, there may still be room for the diaphragm to deflect before coming into contact with the undersurface of the wafer to be bonded above it. Of course, by using a cavity in the surface opposite the diaphragm, the depth may be further reduced if desired. Previous techniques describe successful bonding with thicknesses at least three times greater than what we have done. The closest apparent previous example is in report by Hannenborg and Ohlckers, "Anodic Bonding of Silicon Chips Using Sputter-Deposited Pyrex 7740 Thin Films," 12th Nordic Semiconductor Proceedings, Center for Industrial Research, Oslo, Norway; in which is described achieving 1 micron Pyrex anodic bonding. However, the authors do not describe how to accomplish this with repeatability, and 1 micron appears to be as thin as they can go. Our process can yield 1000 Angstrom thickness bonding and we have been able to bond wafers with 7000 Angstrom thickness Pyrex between them, and our process also produces good results at 5 micron thicknesses.

After sputtering on one micron of Pyrex, the preferred process anneals the wafers at 650° Centigrade for about 60 minutes in nitrogen. The range 600°-700° is probably acceptable and the temperature range may be extendable if steam is used instead of nitrogen.

An apparently extremely important part of the inventive anodic bonding process is to dip the sputtered wafers with the Pyrex (or similar) sputtered films in the following solutions. Buffered oxide etch for approximately 15 seconds, rinse in deionized water, then dip in an aqueous solution of potassium hydroxide and $H_2O_2$ (preferred composition approximates: $KOH:H_2O_2:H_2O$ (40 gms:350 ml:350 ml)) for 30 seconds, and finally rinse in deionized water. This process greatly increases yield of good thermoelectric bonds. If one of the wafers has metalization on its surface, that wafer should not be subjected to this dip process. The process increases yield whether one or both of the wafers are subject to the dip steps.

The buffered oxide etch we used was a 10% HF buffered solution, although other etchants could be used. The consideration here is that the etchant not be too strong to damage the sensitive structures on the surface being etched, but strong enough and dipped long enough to form a hydrophobic surface. The 15 second recommended time is near the minimum acceptable time to accomplish this requirement.

Likewise, other hydroxides, such as ammonium hydroxide, may be substituted for the KOH. The 30 second recommended time here is also near the minimum required to form a hydrophobic surface.

The wafers are then aligned and bonded. It is preferred that a vacuum be created between the wafers before bonding. The preferred temperature for one micron Pyrex is 400°–450° Centigrade but variations are acceptable. Voltage of 15-20 volts should be applied at peak temperatures and allowed to rise up to around 100 volts during the cooling to room temperature. At high temperatures, voltage should not be high Five minutes at high temperature is a good time but variations are acceptable.

The temperature, the voltage and the time the device must be subjected to these varies. Longer times and higher voltages and temperatures will generally produce better bonds, but risk damaging piezoresistive sensors and other electrical structures. Using substantially lower values of 20% less than those recommended ma reduce the yield of good bonds.

It is claimed:

1. A diaphragm transducer responsive to changes in a relevant fluid or fluids, comprising:
    a diaphragm layer bonded on one side by an A surface and bounded on the opposite side by a B surface, an area extending between the A and B surfaces constituting a flexible diaphragm;
    an A wafer bounded on one side by an inner surface and bounded on the opposite side by an outer surface, said inner surface bonded to the A surface of the diaphragm layer, said A wafer containing an A cavity, said A cavity being located adjacent and opening to the diaphragm;
    a B wafer bounded on one side by an inner surface and bounded on the opposite side by an outer surface, said inner surface bonded to the B surface of the diaphragm layer, said B wafer containing a B cavity, said B cavity being and located in the bonded structure adjacent and opening to the diaphragm, and on the opposite side thereof from said A cavity;
    and wherein an A access passage connects the A cavity to an outer surface of either wafer A or wafer B and a B access passageway connects the B cavity to the outer surface of either wafer A or wafer B, and wherein each access passageway is sufficiently large to allow for communication of a relevant fluid there through;
    and wherein said diaphragm layer contains a second diaphragm and wherein said A wafer further contains a second A cavity adjacent and opening to said second diaphragm.

2. A diaphragm transducer as set forth in claim 1 wherein said second A cavity is in communicating connection with a relevant fluid via said A access passageway.

3. A diaphragm transducer as set forth in claim 2 wherein said A access passageway provides access to a relevant fluid located on the outside of said A wafer and wherein said B access passageway provides access to a separate relevant fluid on the outside of said B wafer.

4. A diaphragm transducer as set forth in claim 3 wherein said A and B access passageways both provide access to separate relevant fluids on the outside of the same wafer.

* * * * *